United States Patent
Balakrishnan et al.

(10) Patent No.: US 10,170,302 B2
(45) Date of Patent: ***Jan. 1, 2019

(54) SUPERLATTICE LATERAL BIPOLAR JUNCTION TRANSISTOR

(71) Applicant: INTERNATIONAL BUSINESS MACHINES CORPORATION, Armonk, NY (US)

(72) Inventors: Karthik Balakrishnan, White Plains, NY (US); Stephen W. Bedell, Wrappingers Falls, NY (US); Pouya Hashemi, White Plains, NY (US); Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/847,250

(22) Filed: Dec. 19, 2017

(65) Prior Publication Data

US 2018/0122925 A1 May 3, 2018

Related U.S. Application Data

(60) Continuation of application No. 15/584,851, filed on May 2, 2017, now Pat. No. 9,935,185, which is a
(Continued)

(51) Int. Cl.
*H01L 21/02* (2006.01)
*H01L 29/165* (2006.01)
(Continued)

(52) U.S. Cl.
CPC .... *H01L 21/02507* (2013.01); *H01L 29/1008* (2013.01); *H01L 29/155* (2013.01);
(Continued)

(58) Field of Classification Search
CPC .......... H01L 21/02507; H01L 21/8249; H01L 29/1008; H01L 29/735; H01L 29/6625; H01L 29/42304; H01L 29/66234
(Continued)

(56) References Cited

U.S. PATENT DOCUMENTS

| 4,711,857 A | 12/1987 | Cheng |
| 5,880,482 A | 3/1999 | Adesida et al. |

(Continued)

FOREIGN PATENT DOCUMENTS

CN 104681651 6/2015

OTHER PUBLICATIONS

List of IBM Patents or Patent Applications Treated as Related dated Dec. 19, 2017, 2 pages.
(Continued)

*Primary Examiner* — Anthony Ho
(74) *Attorney, Agent, or Firm* — Tutunjian & Bitetto, P.C.; Erik Johnson

(57) ABSTRACT

A bipolar junction transistor includes an intrinsic base formed on a substrate. The intrinsic base includes a superlattice stack including a plurality of alternating layers of semiconductor material. A collector and emitter are formed adjacent to the intrinsic base on opposite sides of the base. An extrinsic base structure is formed on the intrinsic base.

9 Claims, 7 Drawing Sheets

Related U.S. Application Data division of application No. 14/978,430, filed on Dec. 22, 2015, now Pat. No. 9,666,669.

(51) Int. Cl.
  *H01L 29/66* (2006.01)
  *H01L 29/15* (2006.01)
  *H01L 29/735* (2006.01)
  *H01L 29/10* (2006.01)
  *H01L 29/73* (2006.01)
  *H01L 29/08* (2006.01)
  *H01L 21/8249* (2006.01)
  *H01L 29/06* (2006.01)
  *H01L 29/423* (2006.01)

(52) U.S. Cl.
  CPC ...... *H01L 29/165* (2013.01); *H01L 29/66242* (2013.01); *H01L 29/735* (2013.01); *H01L 21/8249* (2013.01); *H01L 29/06* (2013.01); *H01L 29/0808* (2013.01); *H01L 29/0821* (2013.01); *H01L 29/42304* (2013.01); *H01L 29/6625* (2013.01); *H01L 29/66234* (2013.01); *H01L 29/66265* (2013.01); *H01L 29/7317* (2013.01)

(58) Field of Classification Search
  USPC .......................................................... 257/15
  See application file for complete search history.

(56) References Cited

U.S. PATENT DOCUMENTS

| | | | |
|---|---|---|---|
| 9,935,185 B2* | 4/2018 | Balakrishnan | H01L 29/165 |
| 2002/0017642 A1 | 2/2002 | Mizushuma et al. | |
| 2010/0065111 A1 | 3/2010 | Fu et al. | |
| 2010/0229926 A1 | 9/2010 | Newman et al. | |
| 2014/0196773 A1 | 7/2014 | Bedell et al. | |
| 2015/0028286 A1 | 1/2015 | Vu et al. | |
| 2015/0263095 A1 | 9/2015 | Chan et al. | |

OTHER PUBLICATIONS

Office Action dated Oct. 21, 2016 for U.S. Appl. No. 14/978,469.

Office Action issued in U.S. Appl. No. 14/978,469 dated Jul. 20, 2017, pp. 1-20.

Lee, B.H. et al., "Performance enhancement on sub-70nm strained silicon SOI MOSFETs on Ultra-thin Thermally Mixed Strained silicon/SiGe on Insulator(TM-SGOI) substrate with Raised S/D" IEDM (2002) pp. 946-948.

Asen-Palmer, M. et al., "Thermal conductivity of germanium crystals with different isotopic compositions" Physical Review B (Oct. 15, 1997) pp. 9431-9447, vol. 56, No. 15.

List of IBM Patents or Patent Applications Treated as Related dated Dec. 22, 2015, 2 pages.

\* cited by examiner

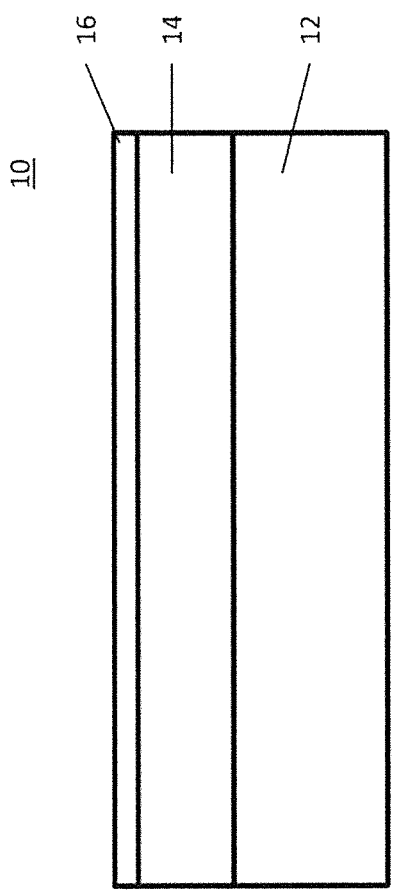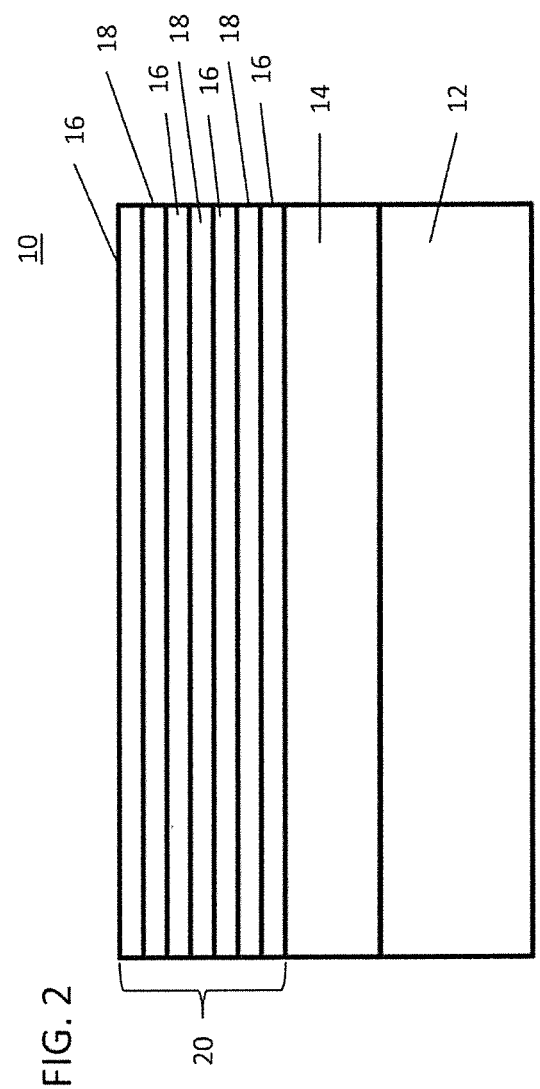

SUPERLATTICE LATERAL BIPOLAR JUNCTION TRANSISTOR

BACKGROUND

Technical Field

The present invention relates to bipolar junction transistor (BJT) devices, and more particularly to devices and methods for formation of a BJT including a superlattice structure.

Description of the Related Art

Lateral bipolar junction transistors (LBJT) provide an alternative path to conventional BJTs due in part to a simpler fabrication process than conventional BJTs. LBJTs can be employed for high-performance tera-hertz applications, and cut-off frequencies can be improved by employing lower band gap materials such as SiGe or Ge. One problem with SiGe in any device is heat dissipation characteristics. The heat dissipation of SiGe can be less than optimal, which can affect device operation, especially, e.g., as transistors operate at high collector current levels.

SUMMARY

A bipolar junction transistor includes an intrinsic base formed on a substrate. The intrinsic base includes a superlattice stack including a plurality of alternating layers of semiconductor material. A collector and emitter are formed adjacent to the intrinsic base on opposite sides of the base. An extrinsic base structure is formed on the intrinsic base.

A bipolar junction transistor includes an extremely thin semiconductor-on-insulator substrate (ETSOI) having a semiconductor layer formed on a buried dielectric layer. A superlattice stack includes a plurality of alternating layers of semiconductor material wherein a first layer of the plurality of alternating layers includes the semiconductor layer. An intrinsic base is formed from the superlattice stack. A collector and emitter are formed adjacent to the intrinsic base on opposite sides of the intrinsic base. An extrinsic base structure is formed on the intrinsic base.

A method for forming a bipolar junction transistor includes depositing a superlattice stack including a plurality of alternating layers of semiconductor material on a substrate; patterning an extrinsic base on the superlattice stack; etching an intrinsic base in the superlattice stack; and growing a collector and emitter adjacent to the intrinsic base on opposite sides of the intrinsic base from a seed layer that includes a portion of a layer of the plurality of alternating layers.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view of an extremely thin semiconductor-on-insulator substrate in accordance with the present principles;

FIG. 2 is a cross-sectional view of the substrate of FIG. 1 showing a superlattice stack formed thereon in accordance with the present principles;

DETAILED DESCRIPTION

Figure 3:
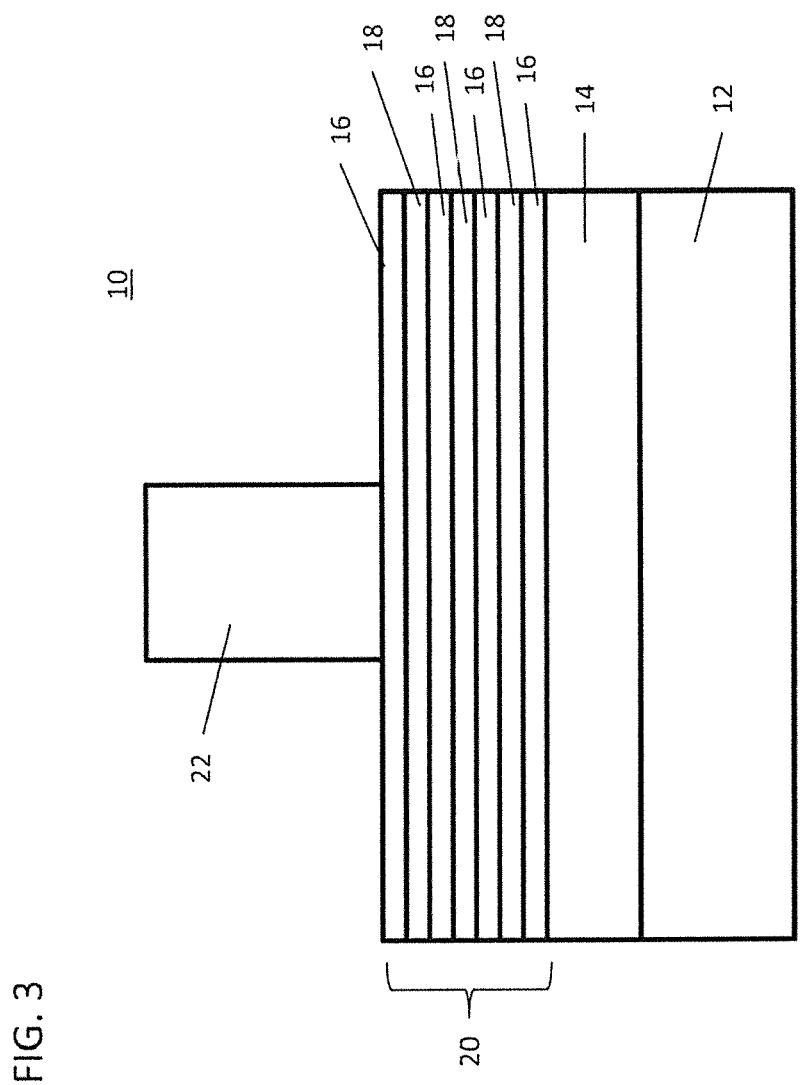
FIG. 3 is a cross-sectional view of the superlattice stack of FIG. 2 showing a extrinsic base formed on the superlattice stack in accordance with the present principles.

In accordance with the present principles, bipolar junction transistors (BJTs) are provided that employ the benefits of SiGe material but enhance the heat dissipation of the SiGe material. In one embodiment, a BJT includes a Si and Ge super-lattice base, and a Si emitter/collector on insulator structure. A Si/Ge super-lattice provides a lower bandgap and higher mobility, increasing cut-off frequency. At the same time, the heat dissipation can be improved as compared to a standard SiGe channel which has a lower thermal conductivity than Si.

A Si/Ge superlattice includes alternating layers of Si and Ge or different dopant concentrations to obtain a lower bandgap, higher charge mobility, increased cut-off frequency and better heat dissipation. If a super-lattice is comprised of epitaxially grown semiconductors which are not lattice-matched to each other, the thickness of each of the alternating layers can be kept below the critical thickness that would otherwise result in an (excessively) high dislocation density due to the accumulation of mismatch strain. Therefore, the overall thickness of the superlattice can be reduced compared to that of a conventional layer.

In useful embodiments, the superlattice is disposed on a substrate, e.g., Si, and may be epitaxially grown in a crystalline form. In addition, isotopically enhanced SiGe may be provided for better heat conduction in some embodiments. The thermal conductivity of SiGe can be increased by reducing mass variance, g, of the SiGe alloy layer and a strained Si layer (if employed). Reduction of mass variation increases the phonon lifetime, thus increasing the thermal conductivity.

The superlattices may include binary or ternary layers with periods of a few monolayers (MLs). The layers may be formed using molecular beam epitaxy (MBE) growth of binary, ternary or quaternary materials of various compositions with enhanced band offset, and without additional source cells and laborious change of cell temperature during growth interruption in the MBE growth technique. In one embodiment, the superlattice layer may include a digital SiGe alloy having a plurality of layers. In one embodiment, each layer may include a different concentration of Ge. In another embodiment, layers are stacked with alternating concentrations of Ge. In another embodiment, layers are stacked with alternating Si and Ge layers.

It is to be understood that the present invention will be described in terms of a given illustrative architecture; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a BJT device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of BJT devices and/or integrated circuit chips with BJT devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys to computers and other applications including computer products or devices having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a substrate 10 is shown in accordance with one illustrative embodiment. The substrate 10 may include a semiconductor-on-insulator (SOI) substrate. In one embodiment, the substrate 10 may include an extremely thin SOI (ETSOI) substrate 10. The ETSOI substrate 10 may include an extremely thin semiconductor layer 16, which may include silicon and may be single-crystalline (c-Si) or microcrystalline (μc-Si), although other materials may be employed (e.g., Ge, SiGe, SiC, etc.). The substrate 10 may include a thickness of about 5 microns or less, although other thicknesses may be employed. The semiconductor layer 16 is provided on a buried dielectric layer 14, which may include an oxide, an oxynitride, a nitride or other suitable dielectric material. The buried dielectric layer 14 is provided on a base substrate 12, which may have a thickness of between about 0.5 nm to 5 microns and which may include any suitable substrate material(s). The base substrate 12 may include, e.g., Si, Ge, SiGe, SiC, III-V materials, or other materials.

The semiconductor layer 16 may be doped for later use as a base for a BJT. The semiconductor layer 16 may include a doping level from, e.g., about $1 \times 10^{18}$ cm$^{-3}$ to about $1 \times 10^{19}$ cm$^{-3}$.

Referring to FIG. 2, a superlattice stack 20 is formed on or using the semiconductor layer 16, e.g., a first layer of the stack 20 may include the semiconductor layer 16 of the ETSOI substrate 10. The superlattice stack 20 may include alternating layers of different elements, e.g., Si and Ge layers or may include alternating layers of different compositions of the same elements, e.g., different Ge concentration in SiGe layers. While the superlattice stack 20 is described in terms of Si and Ge, other materials and material combinations may be employed. The number of layers (16, 18) n is greater than 2 (e.g., at least one layer 16 and one layer 18). A greater number of layers may be employed, e.g., 2-20 layers or more. The superlattice stack 20 includes semiconducting materials having a thickness of a few monolayers to a few nanometers for each layer 16, 18. In one embodiment, the layers 16, 18 are epitaxially grown and include a monocrystalline or polycrystalline structure. The epitaxial growth may be performed by, e.g., molecular beam epitaxy (MBE) or other epitaxial growth process. The superlattice stack 20 may include an overall thickness of between about 20 nm to 100 nm. The layers 16 and 18 of the superlattice are doped in a same way as the semiconductor layer 16 on the buried dielectric layer 14 (e.g., about $1\times10^{18}$ cm$^{-3}$ to $1\times10^{19}$ cm$^{-3}$).

Si/Ge ordered alloy or superlattice stack 20 may have improved thermal conductivity, which can affect transistor characteristics by reducing mass variance, g, of the superlattice stack 20 and/or a strained semiconductor layer, if present. Reduction of mass variation increases phonon lifetime, thus increasing the thermal conductivity.

Phonon mean free path, $L_1 \sim gT^4$, with T as the absolute temperature and g as the mass variance. The mass variance, g, may be computed as follows:

$$g = \frac{\sum c_i M_i^2 - \left(\sum c_i M_i\right)^2}{\left(\sum c_i M_i\right)^2},$$

where $c_i$ and $M_i$ are the concentration and the mass of isotope i. Therefore, the phonon mean path is increased with a larger difference between isotope mass and concentration. The superlattice stack 20 may include adjustments to the mass variance, g, e.g., higher concentrations of heavier isotopes to improve thermal conductivity of the superlattice 20.

The principle manner in which mass variance, g, is reduced is to grow the superlattice 20 using single isotopes of Ge and/or Si (e.g., minimize i in the above expression). Layers formed using atomic isotope compositions that differ from their natural abundance are said to be isotopically enriched. For example, isotopically enriched layers containing Ge isotopes: $^{70}$Ge, $^{72}$Ge, $^{73}$Ge, $^{74}$Ge and $^{76}$Ge may be employed in the Ge or SiGe of the superlattice 20 to improve phonon mean free path and thermal conductivity with the more abundant species $^{70}$Ge, $^{72}$Ge, and $^{76}$Ge being preferred. For example, Si isotopes: $^{28}$Si, $^{29}$Si, $^{30}$Si may be employed with $^{28}$Si being preferred.

Ge isotopes may be employed for layers 16 and Si isotopes may be employed for layers 18 (or vice versa) to improve phonon length and thermal conductivity. In addition or instead, a strained layer (if present) may have mass variance changed to improve phonon length and thermal conductivity.

The isotope mass and concentration may be altered using source materials (in a vacuum chamber) including the isotopes in a particular concentration to be deposited during epitaxial growth. The layers 16, 18 may include different isotopes or the same isotopes and include different proportions of the isotopes. In one embodiment, the Si and Ge layers 16 and 18 are isotopically enriched with, $^{28}$Si and $^{74}$Ge layers.

Referring to FIG. 3, a layer of material is formed on the superlattice stack 20, and patterned (by etching, e.g., reactive ion etching) to form an extrinsic base conductor 22 for the BJT. The extrinsic base 22 may include a doped polysilicon material, although other suitable extrinsic base materials may be employed. A top-most layer 16 may include an extremely thin natural oxide (not shown) to provide an etch stop for the extrinsic base to be formed. The patterning of the extrinsic base 22 may include using a lithography process although other patterning processes may be employed, e.g., a sidewall image transfer (SIT), etc.

Figure 4:
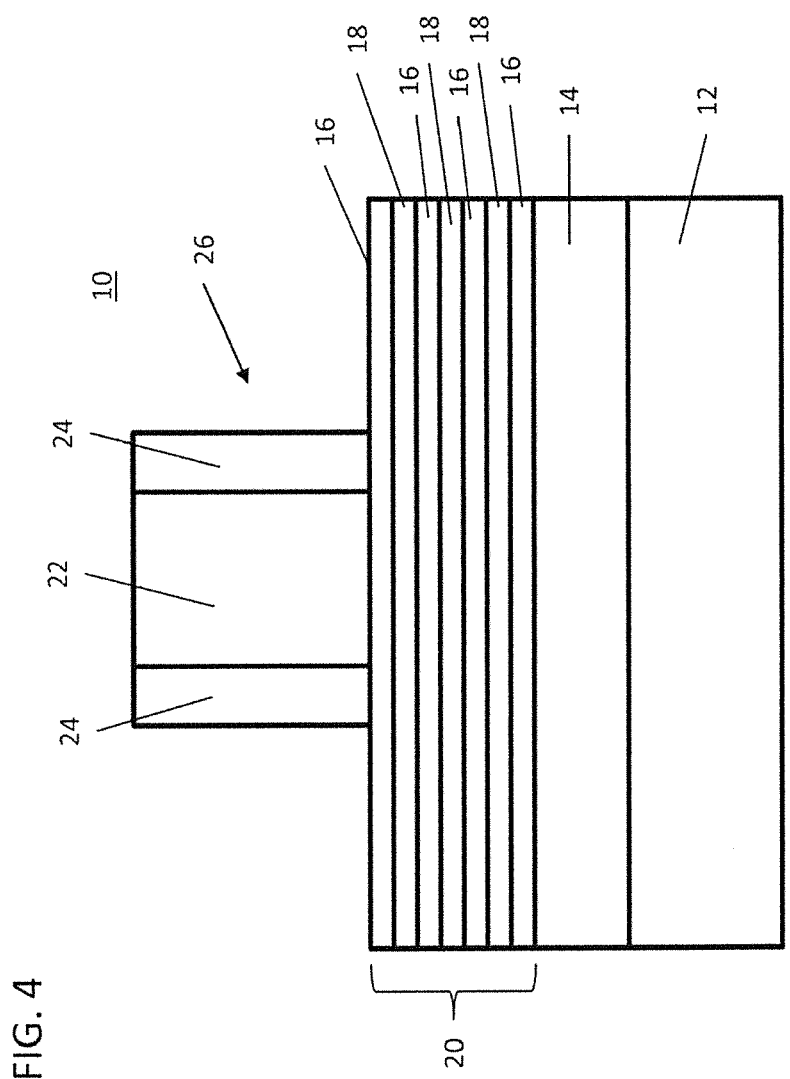
FIG. 4 is a cross-sectional view of the superlattice stack of FIG. 3 showing spacers formed on sidewalls of the extrinsic base in accordance with the present principles.

Referring to FIG. 4, a dielectric layer is conformally formed over the extrinsic base 22 and etched back to form spacers 24. The spacers 24 may include a silicon nitride, although other dielectric materials may be employed. An extrinsic base structure 26 including the extrinsic base 22 and spacers 24 may be employed as a mask for etching the superlattice stack 20 and forming emitter and collector regions as will be described.

Figure 5:
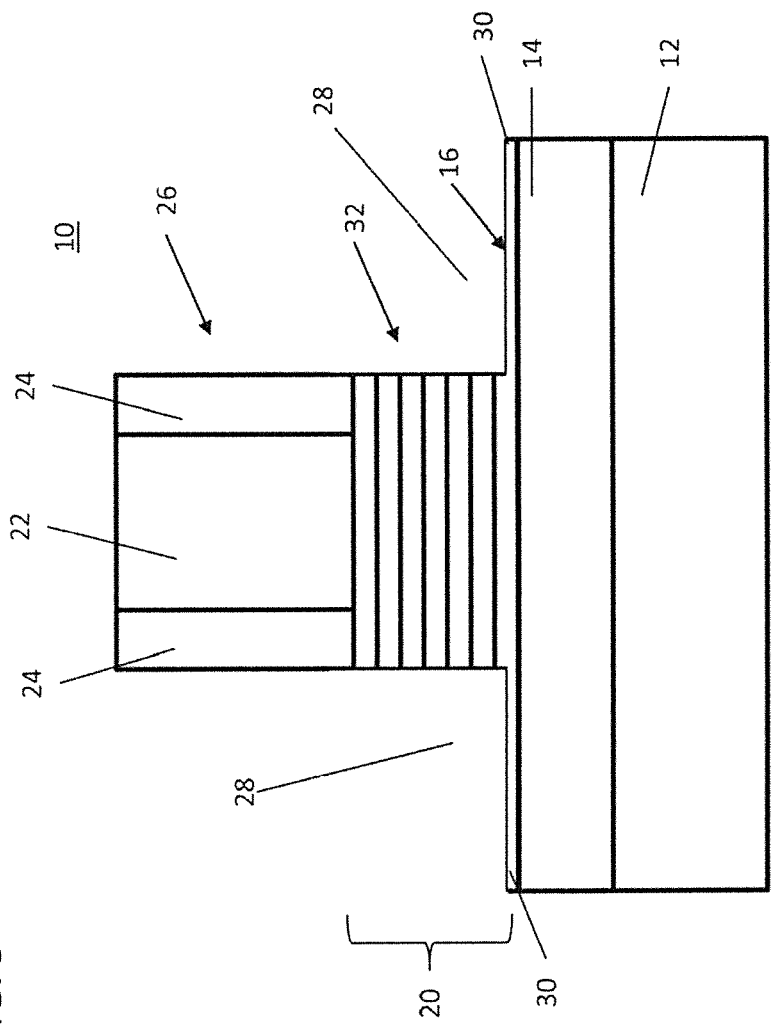
FIG. 5 is a cross-sectional view of the device of FIG. 4 showing the superlattice stack etched to form a base in accordance with the present principles.

Referring to FIG. 5, an etch process, such as a reactive ion etch (RIB) process is performed to etch portions of the superlattice 20 adjacent to the extrinsic base structure 26. A portion 30 of a bottom-most layer 16 is left after the etch process to function as a seed layer for the self-aligned formation of emitter and collector regions. The etch process forms recessed regions 28, which will be employed for the formation of the emitter and collector regions. The etch process defines an intrinsic base region 32 for the BJT.

Figure 6:
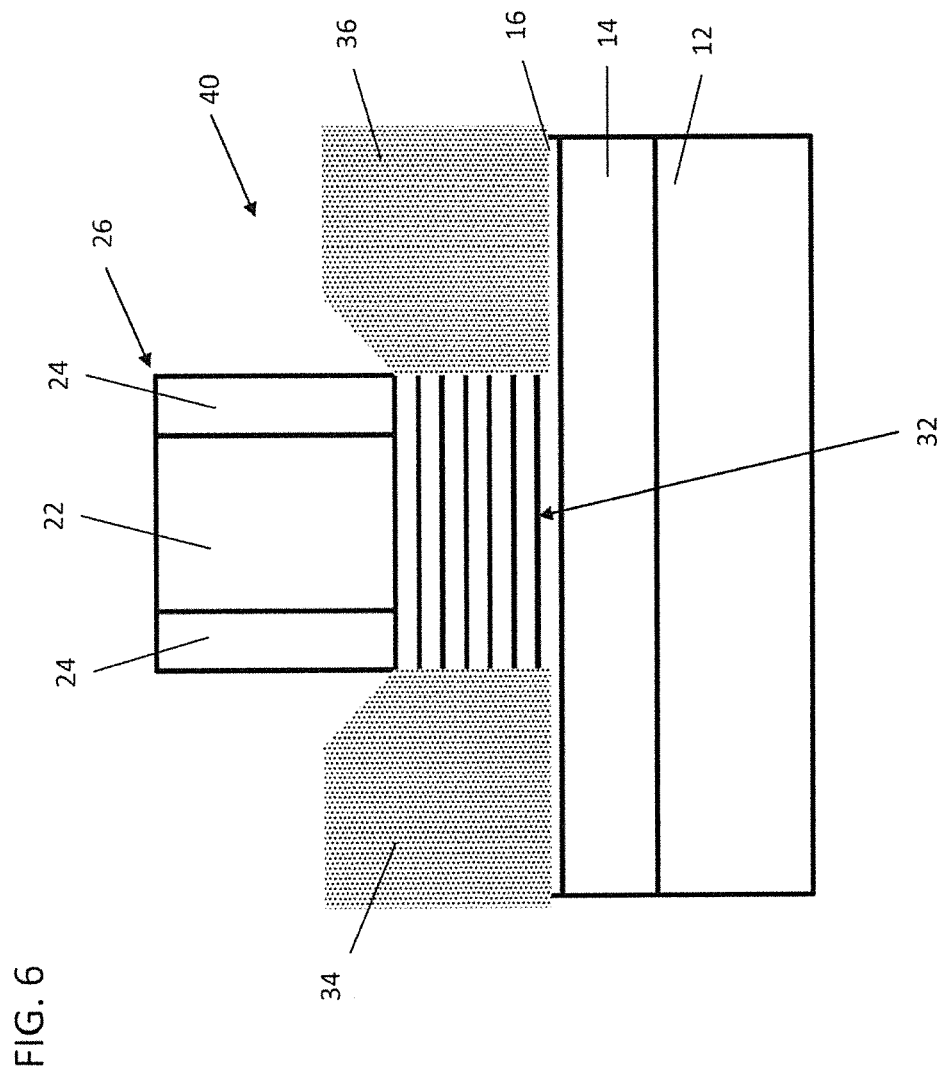
FIG. 6 is a cross-sectional view of the device of FIG. 5 showing collector and emitter regions grown on a portion of a semiconductor layer of the superlattice stack in accordance with the present principles.

Referring to FIG. 6, a BJT 40 is fabricated by forming an emitter 34 and a collector 36. The emitter 34 and collector 36 may be epitaxially grown using the semiconductor layer 16 as a seed layer. The emitter 34 and collector 36 may be doped in-situ or by implantation. The emitter 34 and collector 36 include dopants of a same conductivity type, which is opposite to the conductivity type of the dopants employed in the base 32. The BJT 40 may include an NPN or a PNP junction or may include any orientation, e.g., vertical, lateral, etc. In one embodiment, the BJT 40 is a lateral BJT as depicted.

Further processing of the BJT 40 includes the formation and patterning of a dielectric layer. Opening the dielectric layer to form contact vias. A conductor is deposited to form a base contact, a collector contact and an emitter contact. Excess conductor is planarized and additional metal lines, etc. are formed.

Figure 7:
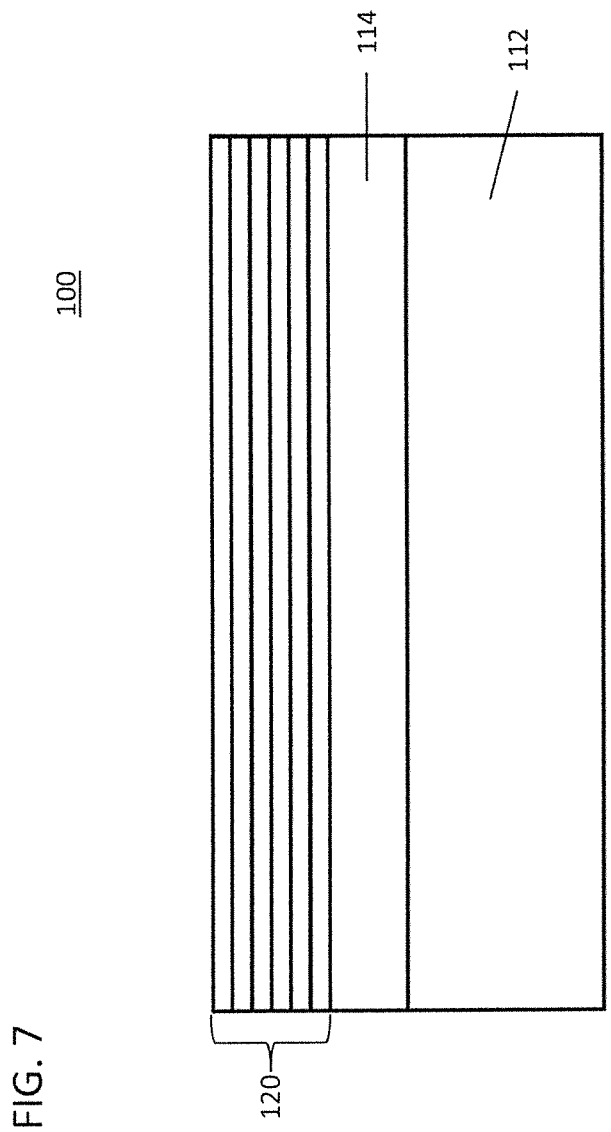
FIG. 7 is a cross-sectional view of a device with a superlattice stack formed on a strained semiconductor layer wherein one or more of the strained semiconductor layer and the superlattice stack includes an adjusted mass variance in accordance with the present principles.

Referring to FIG. 7, a partially fabricated device 100 is shown in accordance with an illustrative embodiment. In the device 100, a substrate 112 includes a strained layer 114 formed thereon. The substrate 112 may include a SOI substrate, etc. The strained layer 114 may include a strained semiconductor material, such as, e.g., SiGe, Si, Ge, etc. The strained layer 114 may be grown on the substrate or transferred to the substrate. The strained layer 114 may be employed to grow a superlattice stack 120 having the same properties as stack 20, but including the strain from the strained layer 114. The strained layer 114 layer may include isotopically enriched materials to adjust thermal properties as described above. In addition, the superlattice stack 120 may also include isotopically enriched materials to adjust thermal properties. One or both of the strained layer 114 layer and the superlattice stack 120 may include isotopically enriched materials. In one example, the strained layer 114 may include, e.g., $^{28}$Si$^{74}$Ge or other isotopes, and the superlattice stack 120 may include alternating layers of, e.g., $^{28}$Si and $^{74}$Ge or other isotopes. The isotopically enriched structures may be employed to further improve heat transfer from the device.

Figure 8:
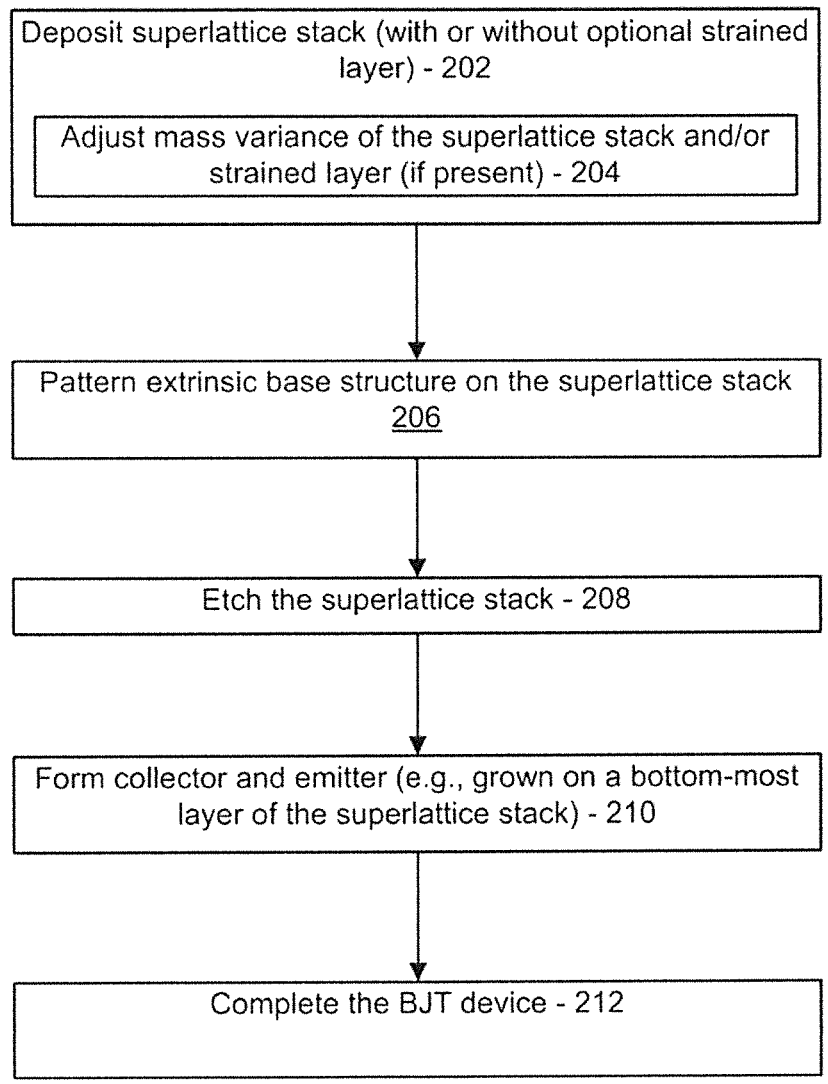
FIG. 8 is a block/flow diagram showing a method for fabricating a bipolar junction transistor in accordance with illustrative embodiments.

Referring to FIG. 8, methods for forming a BJT device are illustratively depicted in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a superlattice stack is deposited on a substrate (which may be optionally removed at a later time) and/or on an optional a strained semiconductor layer. The superlattice stack includes a plurality of alternating layers of semiconductor material on a substrate. In one embodiment, the alternating layers include Si and Ge (or different/alternating compositions of SiGe). The superlattice stack may be doped during formation and may be isotopically enhanced during formation as well.

In one embodiment, the substrate may include a SOI substrate and in particular an ETSOI substrate. If an ETSOI substrate is employed, the semiconductor layer of this substrate may be employed as a first layer in forming the superlattice stack. The semiconductor layer of the ETSOI may include the strained layer.

In block 204, a mass variance of the superlattice stack and/or the strained semiconductor layer may be adjusted to increase thermal conductivity by isotope enrichment into the superlattice stack. For example, $^{28}$Si may be introduced into Si-containing layers and $^{74}$Ge may be introduced into Ge-containing layers.

In block 206, an extrinsic base structure is patterned on the superlattice stack. The extrinsic base structure includes an extrinsic base and may include sidewall spacers or other structures. The extrinsic base may include doped polysilicon. In block 208, an intrinsic base (or base) is etched from the superlattice stack. The extrinsic base structure may be employed as a mask for a digital etch process. In one embodiment, a bottom-most layer is maintained to be employed as a seed layer for collector and emitter growth.

In block 210, a collector and emitter are grown adjacent to the base on opposite sides of the base from the seed layer. The seed layer includes a portion of a layer of the plurality of alternating layers. The collector and emitter may be epitaxially grown and doped in-situ. In block 212, contacts and other structures are formed to complete the BJT device.

Having described preferred embodiments superlattice lateral bipolar junction transistor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a bipolar junction transistor, comprising:
   patterning an extrinsic base on a superlattice stack including a plurality of alternating layers of semiconductor material on a substrate;
   etching an intrinsic base in the superlattice stack; and
   growing a collector and emitter adjacent to the intrinsic base on opposite sides of the intrinsic base.

2. The method as recited in claim 1, wherein the superlattice stack includes alternating layers of Si and Ge.

3. The method as recited in claim 1, wherein the superlattice stack is deposited on a strained semiconductor layer.

4. The method as recited in claim 3, further comprising adjusting a mass variance to increase thermal conductivity of the strained semiconductor layer by isotope enrichment of the strained semiconductor layer.

5. The method as recited in claim 1, further comprising adjusting a mass variance to increase thermal conductivity of the superlattice stack by isotope enrichment of the superlattice stack.

6. The method as recited in claim 1, wherein the superlattice stack includes alternating materials in the alternating layers.

7. The method as recited in claim 1, wherein the substrate is an extremely thin semiconductor-on-insulator (ETSOI) substrate.

8. The method as recited in claim 7, wherein a semiconductor layer of the ETSOI substrate forms a layer of the superlattice stack.

9. The method as recited in claim 1, wherein the alternating layers are lattice mismatched to each other.

\* \* \* \* \*